United States Patent [19]
Mikeska et al.

[11] Patent Number: 5,085,720
[45] Date of Patent: Feb. 4, 1992

[54] METHOD FOR REDUCING SHRINKAGE DURING FIRING OF GREEN CERAMIC BODIES

[75] Inventors: Kurt R. Mikeska, Wilmington; Daniel T. Schaefer, Newark; Richard H. Jensen, Wilmington, all of Del.

[73] Assignee: E. I. Du Pont de Nemours and Company, Wilmington, Del.

[21] Appl. No.: 692,651

[22] Filed: Apr. 29, 1991

Related U.S. Application Data

[63] Continuation of Ser. No. 466,934, Jan. 18, 1990, abandoned, which is a continuation-in-part of Ser. No. 295,803, Jan. 10, 1989, abandoned.

[51] Int. Cl.$^5$ .............................................. B32B 18/00
[52] U.S. Cl. ..................... 156/89; 156/289; 264/56; 264/59; 264/61; 264/63
[58] Field of Search .................... 156/89, 289; 264/56, 264/58, 59, 61, 63

[56] References Cited

U.S. PATENT DOCUMENTS

| | | | |
|---|---|---|---|
| 3,695,960 | 10/1972 | Richter | 156/89 |
| 4,753,694 | 6/1988 | Herron et al. | 156/89 |
| 4,879,156 | 11/1989 | Herron et al. | 428/137 |

OTHER PUBLICATIONS

"Isotropic Ceramic Green Sheet Fabrication Method", Best, IBM Tech. Discl. Bull., vol. 15, No. 11, 4/1973.
"Thermoplastic Powders as Filling Materials for Special Ceramic Substrates", Franz et al., IBM Tech. Discl. Bull., vol. 16, No. 4, 9/1973.

*Primary Examiner*—Caleb Weston

[57] ABSTRACT

A method for reducing X-Y shrinkage during firing of green ceramic bodies in which a release layer, which becomes porous during firing, is placed upon the ceramic body and the assemblage is fired while maintaining pressure on the assemblage normal to the body surface.

27 Claims, 4 Drawing Sheets

METHOD FOR REDUCING SHRINKAGE DURING FIRING OF GREEN CERAMIC BODIES

CROSS-REFERENCE TO RELATED APPLICATION

This application is a continuation of application Ser. No. 07/466,934 filed Jan. 18, 1990, abandoned, which in turn is a continuation-in-part of co-pending patent application Ser. No. 07/295,803 filed Jan. 10, 1989 now abandoned.

FIELD OF INVENTION

The invention relates to a method for substantially reducing or controlling planar shrinkage and reducing distortion of ceramic bodies during firing.

BACKGROUND OF THE INVENTION

An interconnect circuit board is the physical realization of electronic circuits or subsystems from a number of extremely small circuit elements electrically and mechanically interconnected. It is frequently desirable to combine these diverse type electronic components in an arrangement so that they can be physically isolated and mounted adjacent one another in a single compact package and electrically connected to each other and/or to common connections extending from the package.

Complex electronic circuits generally require that the circuit be constructed of several layers of conductors separated by insulating dielectric layers. The conductive layers are interconnected between levels by electrically conductive pathways through the dielectric called vias. Such a multilayer structure allows a circuit to be more compact.

One well known method for constructing a multilayer circuit is by co-firing a multiplicity of ceramic tape dielectrics on which conductors have been printed with metallized vias extending through the dielectric layers to interconnect the various conductor layers. (See Steinberg, U.S. Pat. No. 4,654,095.) The tape layers are stacked in registry and pressed together at a preselected temperature and pressure to form a monolithic structure which is fired at an elevated temperature to drive off the organic binder, sinter the conductive metal and densify the dielectric. This process has the advantage over classical "thick film" methods since firing need only be performed once, saving fabricating time and labor and limiting the diffusion of mobile metals which can cause shorting between the conductors. However, this process has the disadvantage that the amount of shrinkage which occurs on firing may be difficult to control. This dimensional uncertainty is particularly undesirable in large, complex circuits and can result in misregistration during subsequent assembly operations.

Constrained sintering, or firing of a ceramic body with an external force applied, is a well known method for both reducing the porosity of and controlling the shape (dimensions) of ceramic parts. (See Takeda et al., U.S. Pat. No. 4,585,706; Kingery et al., *Introduction to Ceramics*, p. 502-503, Wiley, 1976.) Constrained sintering of ceramic circuits in simple molds is made difficult by the tendency for the part to adhere to the mold and/or for cross contamination to occur between the part and the mold. Further, application of a constraining force to the surface of a ceramic part during burnout of the organic binder may restrict the escape of volatiles, causing incomplete burnout and/or distortion. If a method were established whereby ceramic circuits could be constrained-sintered without adhering to the mold, without cross contamination with the mold, and without restricting the escape of volatiles during burnout, dimensional uncertainty in the final circuit could be largely eliminated and processing steps could be simplified or eliminated. The advantage would be greater yet if the method would permit co-firing of conductive metallic pathways on the outer surfaces of the ceramic circuit.

Flaitz et al. (European Patent Application 0 243 858) describe three approaches to circumventing the aforementioned difficulties. With the first approach, constraint is applied only to the outer edges (periphery) of the part, providing an open escape path for volatiles and entry path for oxygen. With the second approach, a co-extensive force is applied to the entire surface of the piece to be sintered by either using co-extensive porous platens or by application of an air-bearing force to the surface or surfaces of the piece to be sintered. With the third approach, a frictional force is applied to the sintering body by use of contact sheets comprised of a porous composition which does not sinter or shrink during the heating cycle and which prohibit any shrinkage of the substrate. The composition of the contact sheets is selected so that they remain porous during firing, do not fuse to the ceramic, are thermally stable so that they will not shrink or expand during the sintering cycle, and have continuous mechanical integrity/rigidity. The contact sheets maintain their dimensions during the sintering cycle, thus restricting the ceramic part from shrinking. After lamination of the contact sheets to the article to be sintered, sintering takes place without use of additional weights.

SUMMARY OF THE INVENTION

In its primary aspect, the invention is directed to a method for reducing X-Y shrinkage during firing of green ceramic bodies comprising the sequential steps of a. Providing a green ceramic body comprising an admixture of finely divided particles of ceramic solids and sinterable inorganic binder dispersed in a volatilizable solid polymeric binder;

b. Applying to a surface of the green ceramic body a flexible release layer comprising finely divided particles of non-metallic inorganic solids dispersed in volatilizable organic medium comprising at least 10% by volume, basis non-metallic inorganic solids, of volatilizable polymeric binder, the Penetration of the sinterable inorganic binder being no more than 50 $\mu$m;

c. While maintaining unidirectional pressure normal to the exposed surface of the release layer, firing the assemblage at a temperature and for a time sufficient to effect volatilization of the polymeric binders from both the green ceramic body and the release layer, sintering of the inorganic binder in the green ceramic body without incurring radial bulk flow of the sintered body, and the formation of interconnected porosity in the release layer;

d. Cooling the fired assemblage;

e. Releasing the pressure from the cooled assemblage; and f. Removing the porous release layer from the surface of the sintered ceramic body.

In a second aspect, the invention is directed to a composite ceramic green tape comprising an admixture of finely divided particles of ceramic solids and sinterable inorganic binder dispersed in a volatilizable solid polymeric binder having affixed to a surface thereof an adherent release layer comprising finely divided particles of non-metallic inorganic solids dispersed in a volatilizable solid polymeric binder.

In a still further aspect, the invention is directed to a method for making the composite ceramic green tape comprising the sequential steps of applying to at least one surface of a ceramic green tape a release layer comprising finely divided particles of non-metallic inorganic solids dispersed in a volatilizable organic medium comprising solid polymeric binder dissolved in volatile organic solvent, and removing the organic solvent by evaporation.

PRIOR ART

EPO 87 105 868.1, Flaitz et al.

The patent is directed to a constrained sintering method which uses a restraining force in the z-direction to prohibit x-y distortion, camber and shrinkage during firing of a green ceramic MLC substrate. Prior to firing, porous, rigid green ceramic, thermally stable contact sheets are laminated to the surfaces of the ceramic article in order physically to restrict the ceramic from shrinking. The contact sheets maintain their mechanical integrity and dimensional stability throughout the sintering cycle and the fired sheets are removed from the substrate surface by polishing or scraping.

U.S. Pat. No. 4,585,706, Takeda et al.

The patent is directed to constrained sintering of an article made of aluminum nitride material with a hot (1600-2000° C.) press using uniaxial compression ($>100$ kg/cm$^2$) to enhance the article's thermal conductivity. The patent teaches that when sintering takes place under these conditions, the article shrinks only in the direction of the compressing axis, with the result that the sintered product has a high dimensional precision and a higher mechanical strength than that attained by ordinary pressure sintering methods.

U.S. Pat. No. 4,521,449, Arnold et al.

The patent teaches the use of a dielectric layer of ceramic material to facilitate sintering green ceramic sheets that contain surface vias and pad areas that are joined by indented lines and filled with a conductive metal paste. After firing, the components are coated with a suitable metal to make them solderwettable for lead attachment. The inventors recognize the need for post metallization to accommodate the significant (17%) substrate shrinkage and distortion that is typical for fired ceramic material.

U.S. Pat. No. 4,340,436, Dubetsky et al.

The patent discloses superimposing an inert, coextensive nonadherent, removable, light weight, planar platen onto a green glass ceramic laminate to restrict lateral x-y shrinkage and distortion when the glass has reached coalescent temperature during firing. The inventors reported that platen pressures of about 0.012 to about 0.058 lbs/in$^2$ over the laminate produced enhanced planarity and lateral dimensional integrity.

BRIEF DESCRIPTION OF THE DRAWING

The Drawing consists of four figures.

DETAILED DESCRIPTION OF THE INVENTION

General

The general purpose of the invention is to provide a new and improved method for reducing X-Y shrinkage during the firing of green ceramic bodies. A preferred application of the invention is for fabricating ceramic multilayer circuits using conventional conductive metallizations, including conductors, resistors and the like, and dielectric green tapes in such a manner that the circuit feature dimensions established during via punching and printing are substantially maintained during firing. The method of the invention is therefore more economical in by-passing many of the sources of dimensional uncertainty in ceramic parts and by eliminating many of the circuit development and manufacturing steps necessary to avoid dimensional errors and misregistration.

During the firing cycle, after volatilization of the organic binders, the inorganic components of the tape undergo sintering when heated to a sufficient temperature. During sintering, the particulate-porous tape undergoes changes in its structure which are common to porous fine-grained crystalline and non crystalline materials. There is an increase in grain size, there is a change in pore shape, and there is change in pore size and number. Sintering unusually produces a decrease in porosity and results in densification of the particulate compact.

Central to the invention is the use of a ceramic release tape which is applied to the surface(s) of the ceramic circuit layers, thus allowing a constraining force normal to the plane of the circuit to be applied during sintering. The release tape serves several functions: (1) it aids the constraining process by providing a uniform high friction contact layer which helps eliminate shrinkage in the plane of the sintering part; (2) it evenly distributes the uniaxial load of the constraining dies across the surface of the part. The uniaxial load is applied to aid in the elimination of shrinkage and to hold the release layer in intimate contact with the sintering part; (3) it provides an escape pathway for the volatile components of the ceramic green tape prior to sintering; (4) it prevents contamination between the ceramic circuit and the constraining die; and (5) it provides for clean release of the ceramic circuit from the constraining die since the release tape isolates the ceramic circuit from contact with the press platens. In certain cases, it facilitates co-firing of top surface metallization without incurring damage thereto.

In order for the release layer to perform the above functions effectively, the glass from the ceramic part which is being fired must not substantially penetrate or interact with the release layer during the process. Excessive penetration of the glass into the release layer is likely to inhibit the removal of the release layer from the part being fired and adversely affect the properties of the ceramic substrate if a large quantity of release material were to adhere to the final fired part. When selecting a glass composition for the dielectric, two general requirements should be considered. First, the glass in the dielectric substrate should meet the requirements of the dielectric (i.e., dielectric constant, hermiticity, sinterability, etc.) and second, the composition of the glass should be such as to inhibit glass penetration into the release layer. Penetration inhibition is controlled in part by adjusting variables such as glass viscosity, wetting angle, etc. as will be discussed below.

An analysis of the flow of a liquid into porous media can be used to examine the glass penetration phenomena and give insight into the process. The analysis can be used as a guideline in glass composition selection in conjunction with the glass requirements specified for the dielectric as discussed above. In the following analysis, the porous medium is the release layer and the liquid is the glass in the dielectric being fired.

The analysis was developed based on Darcy's Law to predict the penetration of viscous fluids into porous beds and particularly within the context of the invention, the rate of penetration dl/dt of inorganic binder into the release layer defined by:

$$\frac{dl}{dt} = \frac{D\Delta P}{\eta_L l} \quad (1)$$

where D is the permeability of the porous medium, $\Delta P$ is the driving pressure for penetration, l is the length of penetration of the liquid into the medium at time t, and $\eta_L$ is the viscosity of the liquid.

Equation (1) is valid if we assume the gradiant of pressure with respect to the penetration direction $\nabla P$, is closely approximated by the change in pressure over the penetration distance, or $\Delta P/l$.

Taking into consideration the radius r, of the pore channels in the porous medium, Kozeny and Carmen show in A.E. Scheidegger, *The Physics of Flow Through Porous Media*, The MacMillan Co. (1960) pp 68-90, D, can be expressed as:

$$D = r^2(1-\rho)/20 \quad (2)$$

where $\rho = \rho_B/\rho_s$ is the solid fraction with $\rho_B$ the bulk density and $\rho_s$ the theoretical density of the glass.

$\Delta P$ is the driving pressure acting to force the liquid into the porous medium as is defined as:

$$\Delta P = \frac{2\gamma_{LV}\cos\theta}{r} + P_a \quad (3)$$

where $2\gamma_{LV}\cos\theta/r$ is the capillary pressure, $P_a$ is any external pressure difference, $\gamma_{LV}$ is the liquid vapor surface energy and $\cos\Theta$ is the solid liquid contact angle. For constrained sintering, $P_a$ is the applied constraining load per unit area.

Substituting equation (2) into equation (1) and integrating the substituted equation gives:

$$l^2 = \frac{tr(1-\rho)(2\gamma_{LV}\cos\theta + P_a r)}{10 \eta_L} \quad (4)$$

In practice, $P_a$ is much less than the capillary pressure, therefore equation (4) can be expressed as:

$$l^2 = \frac{tr(1-\rho)2\gamma_{LV}\cos\theta}{10 \eta_L} \quad (5)$$

Figure 4:
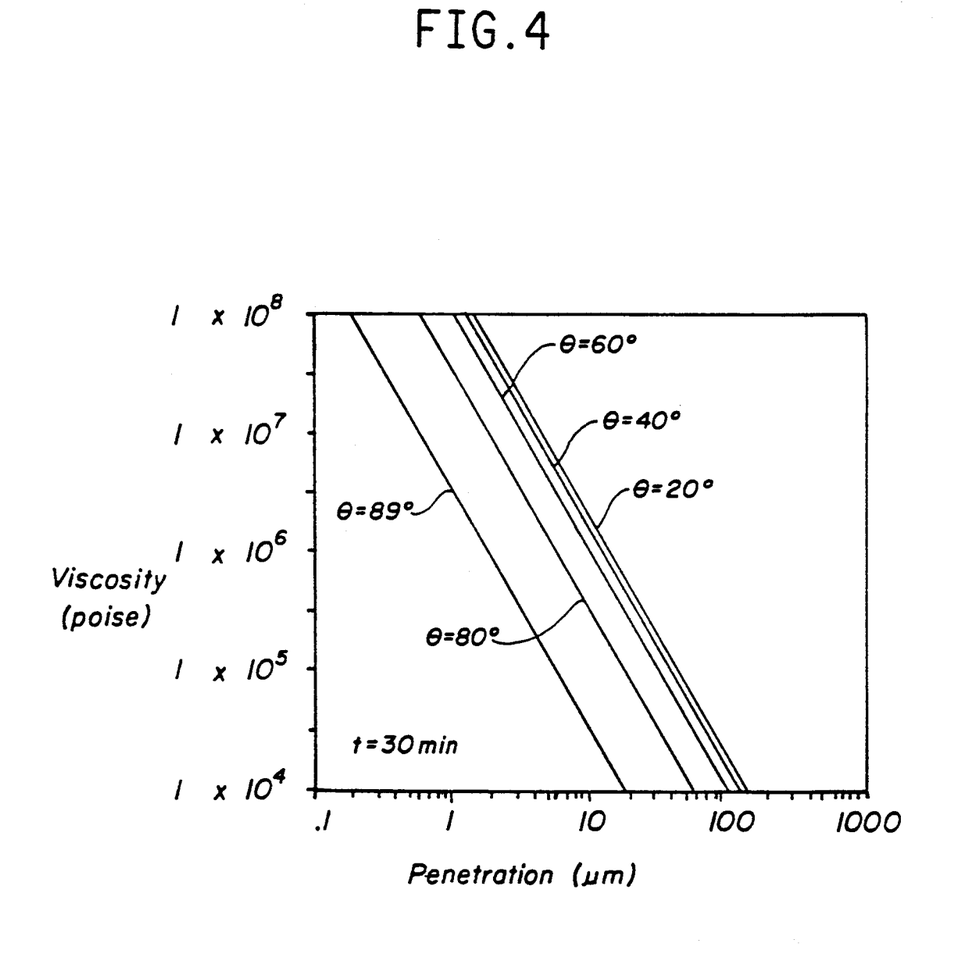
FIG. 4 is a graphical correlation of inorganic binder penetration with viscosity and wetting angle.

For a given body under a constant driving pressure, the depth of penetration is proportional to the square root of time. Several methods for deriving equation (5) are presented in the literature. In a practical constrained sintering situation, the porous medium is the release layer and the viscous liquid is the glass in the substrate being fired. In practice, the viscosity of the glass, contact angle of the glass on the release layer material, porosity and pore radius of the release layer, along with time, can be adjusted to give a desired degree of penetration. It can also be appreciated that the liquid/vapor surface energy can be modified by sintering in more or less reactive atmospheres. FIG. 4 is a plot of penetration as a function of glass liquid viscosity ($\eta_L$) for various contact angles for t=30 min. Radius (r), porous layer density $(1-\rho)$ and liquid/vapor surface energy ($\gamma_{LV}$) can also be used to influence penetration as mentioned above.

As shown by equation (5) and by the correlation given in FIG. 4, penetration can be predicted from the viscosity and contact angle of the inorganic binder and thus can be controlled by the adjustment of those two variables. As used herein, the term "Penetration" refers to the penetration value of the sinterable inorganic binder component of the green ceramic body as determined by the above-described correlation method.

The release tape comprises finely divided particles of non-metallic inorganic solids dispersed in volatilizable organic medium prepared by standard ceramic green tape casting methods. The low sintering rate of the inorganic solids in the release tape preserves the interconnected porosity in the release tape as a pathway for volatiles and other gases to escape from both the green ceramic part being fired and the release tape. While maintaining unidirectional pressure normal to the exposed surface of the release tape, the assemblage is fired at a temperature and for a time sufficient to volatilize the organic binders from both the release tape and the green tape and to sinter the inorganic binder in the green tape. The unidirectional pressure applied during firing is sufficiently large to keep the constraining-release layer in contact with the ceramic part being fired to effectively cause all shrinkage to take place in the direction normal to the plane of the circuit preserving the original X-Y circuit dimensions of the green part. After complete sintering of the green tape layers, the assemblage is cooled and removed from the constraining die. The release tape can be subsequently removed from the surface of the finished part by a dusting or light scraping operation without affecting or damaging conductive pathways.

During the sintering cycle, following volatilization of the organic binders from the release layer and the article to be sintered, the release layer exists as a non-rigid layer of inorganic powder, held in place by the external constraining force. Application of the release layer in the form of a green tape prior to firing ensures that the loose layer of powder will be envenly distributed over the surface of the ceramic part and that the surface of the fired part will be extremely smooth.

The method of the invention can be used to produce ceramic circuits either with or without a prefired refractory substrate backing. The backing may or may not be metallized—in the case of metallized it may or may not be prefired. If a substrate backing is to be used, the green tape circuit layers are placed on the prefired substrate, followed by the release layer. The entire assemblage is then placed in the constraining die or press for firing. If a substrate backing is not to be used, a layer of release tape is placed on both top and bottom of the green tape circuit layers.

In those cases where the adjacent surface of the composite green tape structure bears against a very porous platen, either a thicker release tape layer or multiple tape layers can be applied to prevent incursion of the glass into the platen's large pores. The result is a part with extremely smooth surfaces when sintering is complete. It is preferred that the platen have sufficient porosity to allow the escape of the voltilized organic medium.

In addition, experiments have shown that multiple layers of release tape, typically three or four, give better "cushioning" or pressure distribution during lamination and firing of metallized parts, thereby limiting cracking in those areas near the metallized traces.

Ceramic Solids

The composition of the ceramic solids in the green ceramic body which can be used in the invention is also not itself directly critical so long as the solids are chemically inert with respect to the other materials in the system and have the appropriate physical properties relative to the inorganic binder component of the ceramic body.

The basic physical properties that are essential to the ceramic solids in the ceramic body are (1) that they have sintering temperatures well above the sintering temperatures of the inorganic binder, and (2) that they do not undergo sintering during the firing step of the invention. Thus, in the context of this invention, the term "ceramic solids" refers to inorganic materials, usually oxides, which undergo essentially no sintering under the conditions of firing to which they are subjected in the practice of the invention.

Thus, subject to the above criteria, virtually any high melting inorganic solid can be used as the ceramic solids component of green tape. For example, such materials as $BaTiO_3$, $CaTiO_3$, $SrTiO_3$, $PbTiO_3$, $CaZrO_3$, $BaZrO_3$, $CaSnO_3$, $BaSnO_3$, $Al_2O_3$, metal carbides such as silicon carbide, metal nitrides such as aluminum nitride, minerals such as mullite and kyanite, zirconia and various forms of silica. Even high softening point glasses can be used as the ceramic component providing they have sufficiently high softening points. In may instances, the ceramic component may be chosen on the basis of both its dielectric and thermal expansion properties. Thus, mixtures of such materials may be used in order to match the thermal expansion characteristics of any substrate to which they are applied.

Inorganic Binder

The composition of the inorganic binder which can be used in the ceramic bodies for use in the invention is not itself directly critical so long as it is chemically inert with respect to the other materials in the system and it has the appropriate physical properties relative to the ceramic solids in the ceramic body and the non-metallic solids in the release layer.

In particular, it is essential that the penetration of the inorganic binder component of the ceramic body into the release layer during the firing not exceed 50 $\mu$m and preferably not exceed 25 $\mu$m. If the Pentration exceeds about 50 $\mu$m, removal of the release layer is likely to become difficult. Though the invention is not limited to these temperatures, firing will usually be conducted at a peak temperature of 800°–950° C. with at least 10 minutes time at the peak temperature.

The basic physical properties that are preferred for the inorganic binder in the green ceramic body for use in the method of the invention are (1) that it have a sintering temperature well below that of the ceramic solids in the body, (2) that it undergo viscous phase sintering at the firing temperatures used, and (3) that the wetting angle and viscosity of the inorganic binder are such that it will not penetrate appreciably into the release layer during firing.

The wetting characteristics of the inorganic binder, usually a glass, are determined by measuring the contact angle of the sintered inorganic binder on a smooth planar surface of the inorganic solids contained in the release layer. This procedure is described hereinbelow.

It has been determined that if the inorganic binder has a contact angle of at least 60°, it is sufficiently non-wetting for use in the invention. It is nevertheless preferred that the contact angle of the glass be at least 70°. In the context of the method of the invention, the higher the contact angle, the better are the release properties of the release layer.

When, as is usual, the inorganic binder component of the ceramic green tape is a glass, it may be either a crystallizing or non-crystallizing glass at the firing conditions. Crystallizing glasses are preferred since they have less tendency to undergo flow during firing and thus less tendency to migrate into the release layer.

The particle size and particle size distribution of the inorganic binder are likewise not narrowly critical, and the particles will usually be between 0.5 and 20 microns in size. It is, however, preferred that the 50% point of the inorganic binder, which is defined as equal parts by weight of both larger and smaller particles, be equal to or less than that of the ceramic solids. Sintering rate is related directly to the ratio of inorganic binder to ceramic solids and inversely to the glass transition temperature (Tg) and particle size of the inorganic binder.

The glasses for use as inorganic binder in the method of the invention are prepared by conventional glassmaking techniques such as by mixing the desired component oxides in the desired proportions and heating the mixture to form a melt. As is well known in the art, heating is conducted to a peak temperature and for a time such that the melt becomes entirely liquid and homogeneous. In the present work, the components are premixed by shaking in a polyethylene jar with plastic balls and then melted in a platinum crucible at the desired temperature. The melt is heated at the peak temperature for a period of 1to 1½hours. The melt is then poured into cold water. The maximum temperature of the water during quenching is kept as low as possible by increasing the water-to-melt ratio. The crude frit after separation from water is freed of residual water by drying in air or displacing the water by rinsing with methanol. The crude frit is then ball milled for 3–5 hours in alumina containers using alumina balls. Alumina contamination of the frit is not within the observable limit of x-ray diffraction analysis.

After discharging the milled frit slurry from the mill, excess solvent is removed by decantation and the frit powder is air dried at room temperature. The dried powder is then screened through a 325-mesh screen to remove any large particles. The inorganic binder, like the ceramic solids, should have a surface-to-weight ratio of no more than 10m²/g and at least 75 wt. % of the particles should have aparticle size of 0.3-10 microns.

Polymeric Binder

The orgnic medium in which the glass and refractory inorganic solids are dispersed is comprised of the polymeric binder, optionally having dissolved therein other materials such as plasticizers, release agents, dispersing agents, stripping agents, antifouling agents and wetting agents.

To obtain better binding efficiency, it is preferred to use at least 5% wt. polymer binder for 90% vol. ceramic solids. However, it is further preferred to use no more than 20% wt. polymer binder in 80% wt. ceramic solids. Within these limits, it is desirable to use the least possible amount of binder vis-a-vis solids in order to reduce the amount of organics which must be removed by pyrolysis and to obtain better particle packing which gives reduced shrinkage upon firing.

In the past, various polymeric materials have been employed as the binder for green tapes, e.g., poly(vinyl butyral), poly(vinyl acetate), poly(vinyl alcohol), cellulosic polymers such as methyl cellulose, ethyl cellulose, hydroxyethyl cellulose, methylhydroxyethyl cellulose, atactic polypropylene, polyethylene, silicon polymers such as poly(methyl siloxane), poly(methylphenyl siloxane), polystyrene, butadiene/styrene copolymer, polystyrene, poly(vinyl pyrollidone), polyamides, high molecular weight polyethers, copolymers of ethylene oxide and propylene oxide, polyacrylamides, and various acrylic polymers such as sodium polyacrylate, poly(lower alkyl acrylates), poly(lower alkyl methacrylates) and various copolymers and multipolymers of lower alkyl acrylates and methacrylates. Copolymers of ethyl methacrylate and methyl acrylate and terpolymers of ethyl acrylate, methyl methacrylate and methacrylic acid have been previously used as binders for slip casting materials.

More recently, Usala, in U.S. Pat. No. 4,536,535, has disclosed an organic binder which is a mixture of compatible multipolymers of 0-100% wt. $C_{1-8}$ alkyl methacrylate, 100-0% wt. $C_{1-8}$ alkyl acrylate and 0.5% wt. ethylenically unsaturated carboxylic acid of amine. Because the polymers permit the use of minimum amounts of binder and maximum amounts of dielectric solids, their use is preferred with the dielectric composition of this invention. For this reason, the disclosure of the above-referred Usala patent is incorporated by reference herein.

Frequently, the polymeric binder will also contain a small amount, relative to the binder polymer, of a plasticizer which serves to lower the glass transition temperature (Tg) of the binder polymer. The choice of plasticizers is, of course, determined primarily by the polymer which must be modified. Among the plasticizers which have been used in various binder systems are diethyl phthalate, dibutyl phthalate, dioctyl phthalate, butyl benzyl phthalate, alkyl phosphates, polyalkylene glycols, glycerol, poly(ethylene oxides), hydroxyethylated alkyl phenol, dialkyldithiophosphonate and poly(isobutylene). Of these, butyl benzyl phthalate is most frequently used in acrylic polymer systems because it can be used effectively in relatively small concentrations.

Green Tape Manufacture

Unfired green tapes are prepared by slip casting a slurry of the dielectric particles and inorganic binder dispersed in a solution of binder polymer, plasticizer and solvent onto a carrier such as polypropylene, Mylar ® polyester film or stainless steel and then adjusting the thickness of the cast film by passing the cast slurry under a doctor blade. Thus, green tapes which are used in the invention can be made by such conventional methods, which are described in greater detail in U.S. Pat. No. 4,536,535 to Usala.

It will be understood that the green tapes used in the method of the invention will frequently contain vias for electrical interconnection of layers, registration holes and other perforations to accommodate devices and chip attachment. It has nevertheless been found that the method remains effective to reduce X-Y shrinkage even when the green tape does contain such perforations.

In some instances, the green tape may contain fillers such as ceramic fibers to provide special properties such as thermal conductivity or tensile strength to the fired green tape. Though the invention was developed and is described above primarily in the context of firing green ceramic bodies made from layers of ceramic greem tape, it will be realized that the invention can also be used to reduce X-Y shrinkage during firing of odd-shaped non-planar articles such as cast or molded ceramic parts.

Release Layer

The release layer for use in the method of the invention is comprised of non-metallic particles dispersed in a solid organic polymer binder. As mentioned above, it is preferred that the non-metallic particles in the release layer have a lower sintering rate than the inorganic binder of the substrate being fired at the firing conditions and that the wetting angle of the inorganic binder on the release material and the viscosity of the inorganic binder are such that binder penetration into the release layer is within the bounds stated previously. Thus, the composition of the inorganic solids component of the release layer is likewise not critical so long as the above-mentioned criteria are met. Thus, any non-metallic inorganic material can be used so long as it does not undergo sintering during firing and so long as the wetting angle of the inorganic binder on the release tape and the viscosity of the inorganic binder are within the preferred bounds of inorganic binder penetration into the release layer as the inorganic binder undergoes sintering during the firing process. In many instances, it will be convenient that the solids component of the release layer be of the same composition as the ceramic solids component of the green tape. However, non-ceramic materials such as glasses can be used so long as their softening points are sufficiently high that they do not undergo sintering when they are fired in the presence of the ceramic green tape.

The release layer can be applied in the form either of a green tape or a thick film paste or by a spray process. Regardless of which form in which it is applied, it is essential that the layer be flexible in order to be able to obtain sufficient control of X-Y shrinkage and even to obtain complete elimination of X-Y shrinkage during firing. In general, the same binder polymers which are suitable for the green tape will be suitable for the release layer when it is applied as a green tape.

As used herein, the terms "thick film" and "thick film paste" refer to dispersions of finely divided solids in an organic medium, which dispersions are of paste cnsistency and have a rheology which makes them capable of being applied by conventional screen printing. The organic media for such pastes are ordinarily comprised of liquid binder polymer and various rheological agents dissolved in a solvent, all of which are completely pyrolyzable during the firing process. Such pastes can be either resistive or conductive and, in some instances, may even be dielectric in character. Such compositions may or may not contain an inorganic binder, depending upon whether or not the functional solids are sintered during firing. Conventional organic media of the type used in thick film pastes are also suitable for the release layer. A more detailed discussion of suitable organic medial materials can be found in U.S. Pat. No. 4,536,535 to Usala.

To insure the formation of interconnected porosity in the release layer when it is fired, it is essential that the release layer contain at least 10% by volume non-metallic inorganic solids and preferably at least 20%. The release layer should not, however, contain more than about 50% by volume of such solids and preferably no more than about 40%.

Process Variables

The firing step is preferably conducted under pressure normal to the surface of the ceramic green tape. The amount of pressure needed is quite subjective and not subject to definition by specific ranges. The reason for this is that the pressure must be adjusted on an ad hoc basis to avoid any substantial amount of bulk flow of the green tape solids during firing. The appropriate pressure for any given system is therefore dependent upon the rheology of the green tape solids during the firing step. Such factors as particle size, ratio of inorganic binder to ceramic solids, and binder viscosity profoundly affect the rheology of the green tape during firing. The phenomenon of bulk flow, if it occurs at all, will occur during the sintering phase of the firing step and can be detected by observation.

The firing cycle for the method of the invention is likewise subjective to the physical characteristics of the solids contained in both the green tape and the release layer and also is limited by the capability of the furnace or kiln in which the materials are fired. A typical firing cycle for many applications is to heat the assemblage at the rate of 3° C. per minute to 600° C., then 5° C., per minute to a peak temperature of 850° C., maintaining the assemblage at peak temperature for 30 minutes, and then cooling the assemblage by turning off the furnace. In a typical commercial installation, the firing characteristics of the materials are chosen so that they are suitable for the performace characteristics of the available furnace or kiln. Firing can, of course, be conducted in either a batch, intermittent or continuous fashion.

Upon completion of firing, the release layer is in the form of a porous layer in which the prticles are held together only weakly by van der Waals forces because the binder has been completely volatilized from the layer. Because the layer has little integral strength, it can be easily removed by brushing. The layer tends to come off in the form of small sheets and powder. The removal of the fired release layer is nevertheless characterized by the need for very little mechanical energy, and certainly grinding is not required as it is for prior art processes in which hot pressing is used.

The invention is frequently used in more complex multilayer systems in which one or more of the dielectric layers has printed thereon a thick film electrically functional pattern such as a resistor or conductive lines or both. When this is the case, the dielectric and electrically functional layers can be fired sequentially or they can be co-fired. When such systems are co-fied, the firing temperature profile and/or the components of the dielectric layers and electrically functional layers must be selected in such manner that the organic media of all the layers are completely volatilized and the inorganic binders of the respective layers are well sintered. In some instances, it may be necessary that the conductive phase of the thick film metallization be sintered as well. The selection of components having these relative properties is, of course, well within the skill of the thick film art.

When constrainedly sintering green parts onto an already pre-fired substrate, test results have shown that metal conductors bonded to the substrate, either in the green state of already pre-fired, can be accommodated without inducing cracking in the green material around the metallized traces.

Test Procedures

Contact Angle

The equilibrium shape assumed by a liquid drop placed on a smooth solid surface under the force of gravity is determined by the mechanical force equilibrium of three surface tensions: $\delta(LV)$ at the liquid-vapor interface; $\delta(SL)$ at the liquid-solid interface; and $\delta(SV)$ at the solid-vapor interface. The contact angle is in theory independent of the drop volume and, in the absence of crystallization or interaction between the substrate and the test liquid, depends only upon temperature and the nature of the respective solid, liquid and vapor phases in equilibrium. Contact angle measurements are an accurate method for characterizing the wettability of a solid surface since the tendency for the liquid to spread and "wet" the solids surface increases as the contact angle decreases.

DETAILED DESCRIPTION OF THE DRAWING

Figure 1A:
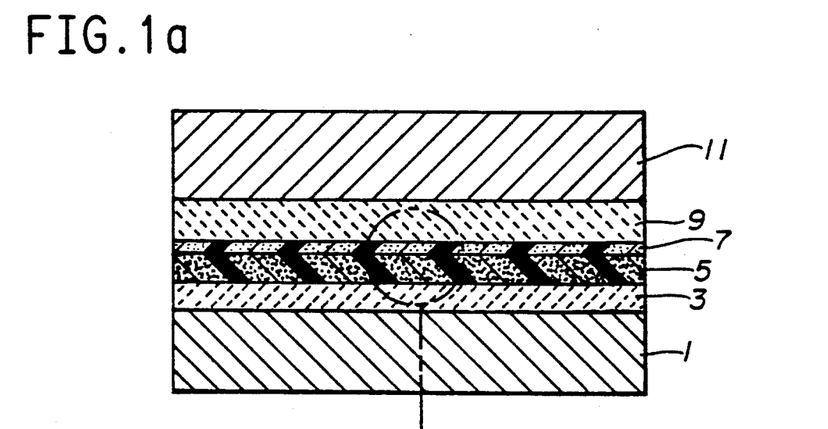
FIGS. 1a and 1b are schematic representations of the arrangement of the various components of the invention prior to carrying out the claimed method in which a release layer is affixed to one layer of a substrate.
Figure 1B:
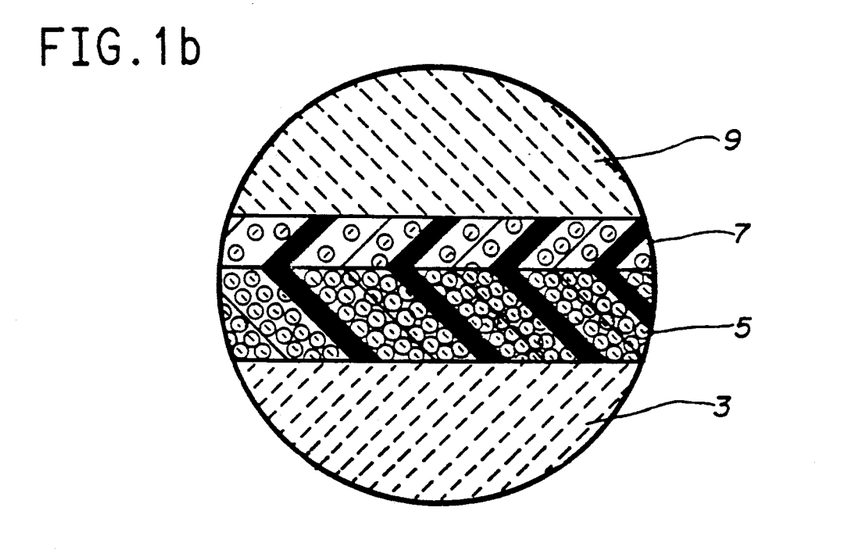

FIG. 1 is a schematic representation of the arrangement of the components of the method of the invention in which a flexible release layer is affixed to only one side of a ceramic green tape.

A pre-fired ceramic substrate 3 (with or without metallization) and a ceramic green tape 5 are aligned and colaminated into an assembly that is positioned atop a rigid supprt die 1. A flexible release layer 7 may be laminated to or otherwise positioned adjacent the exposed surface of green tape 5 with porous plate 9 providing the upper pressure bearing surface for the assembly. The assemblage is then placed in a furnace between upper and lower support dies, 1 and 11 respectively, with an appropriate load of weights to provide a uniform downward pressure on the assemblage during burn out and firing.

Figure 2A:
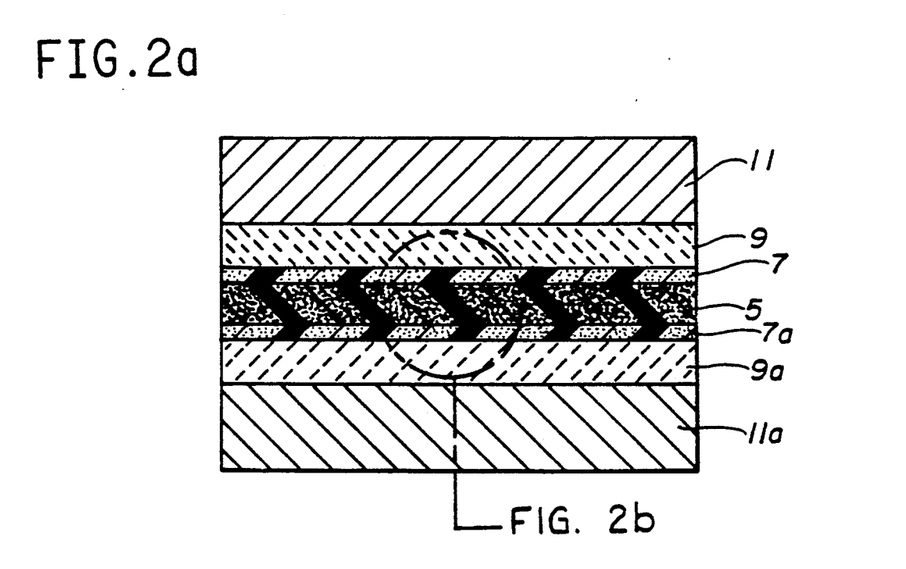
FIGS. 2a and 2b are schematic representations of the arrangement of the various components of the invention prior to carrying out the claimed method in which a release layer is affixed to both sides of a substrate.
Figure 2B:
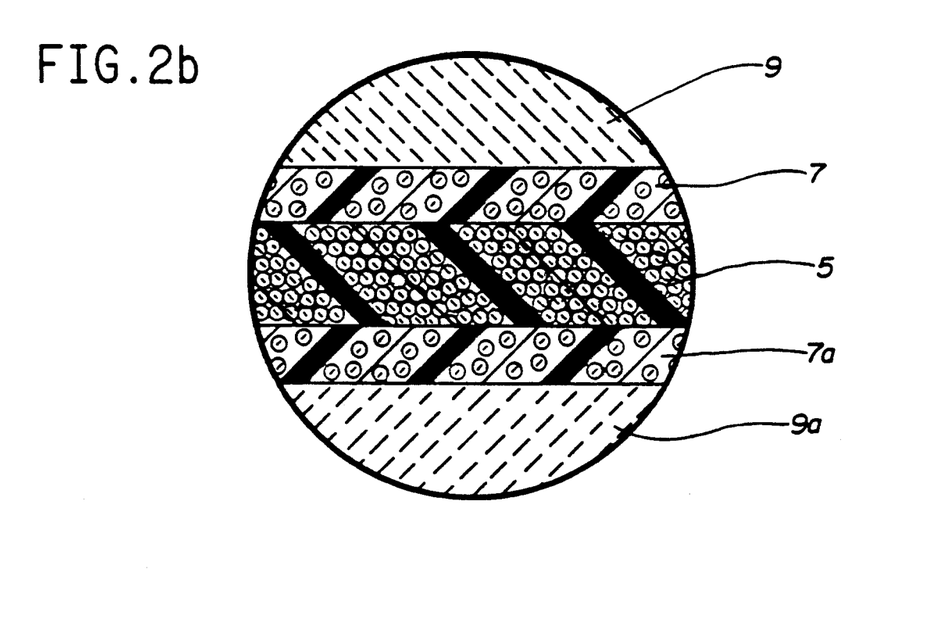
Figure 3A:
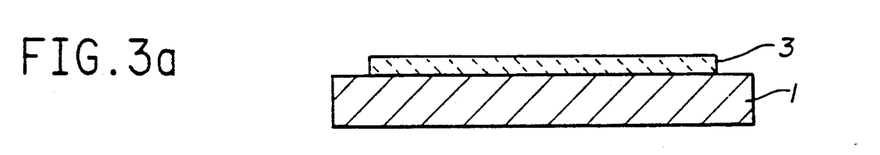
FIGS. 3a-3g are schematic representations of the individual steps of the method of the invention.
Figure 3B:
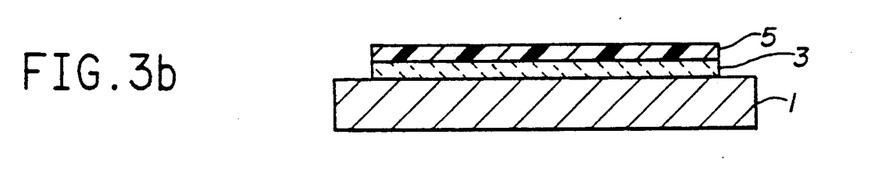
Figure 3C:
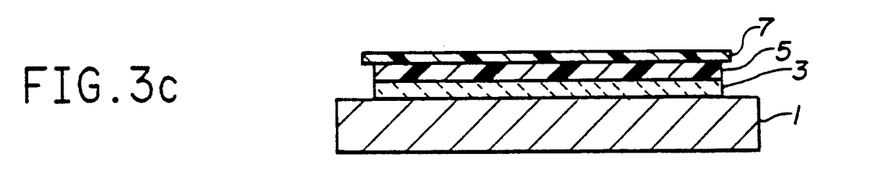
Figure 3D:
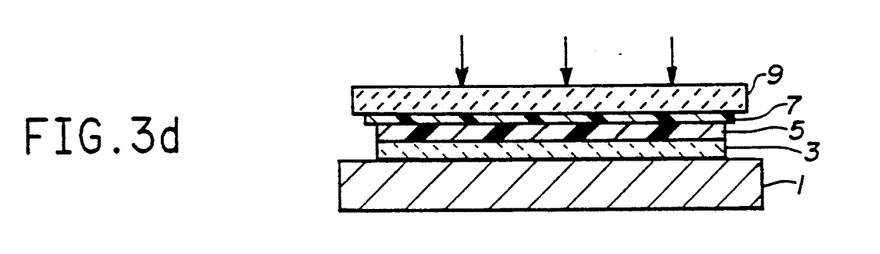
Figure 3E:
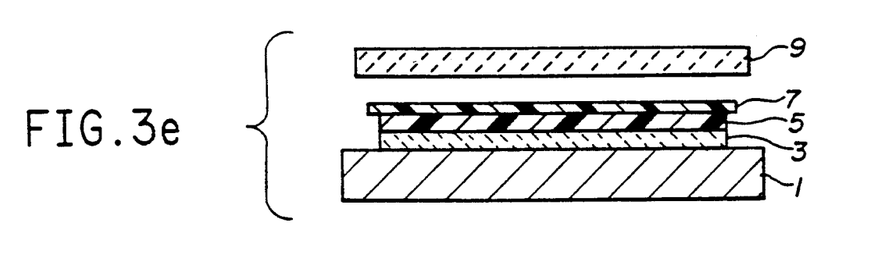
Figure 3F:
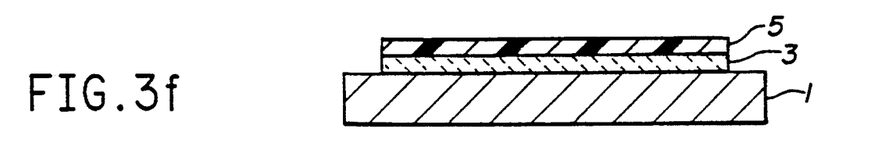
Figure 3G:
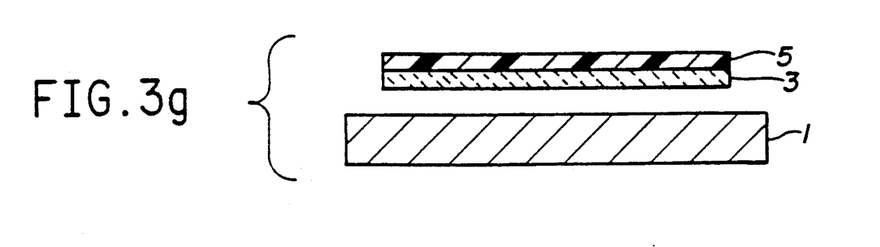

FIG. 2 is a schematic representation of the arrangement of the components of the method of the invention in which a flexible release layer is affixed to both sides of a ceramic green tape.

Both sides of a ceramic green tape 5 are laminated with flexible release layers 7 and 7a. The thusly laminated green tape 5 is placed upon a rigid porous plate 9 and second porous plate 9a is placed upon the above described assemblage. The multiple layer assemblage is then placed in a furnace and an appropriate load of weights 11 and 11a placed thereon to provide a uniform downward pressure on the assemblage as it is fired.

FIG. 3 is a schematic representation of the sequential steps of the method of the invention in which a flexible release layer is affixed to only one side of a ceramic green tape as shown in FIG. 1 of the Drawing. A modified box furnace was used uniaxially (z-direction) to compress the package at a pressure of 5 to 20 psi during the firing cycle.

EXAMPLES

EXAMPLES 1-17

The following set of experiments was conducted to show that the method of the invention eliminates radial shrinkage (i.e. X-Y shrinkage) during firing and provides a means for fabricating multilayer packages with tight dimensional tolerances. The examples show the precise linear dimension control provided by the process. Samples measured in the study were prepared from Du Pont Green Tape (dielectric constant ~6) and low k Du Pont Green Tape (dielectric constant ~4) according to the procedure outlined below. The technique used to measure linear dimension changes during firing is also reviewed.

Samples were prepared by standard multilayer Du Pont Green Tape processing techniques which included cutting blank layers of dielectric tape, screen printing a conductor metallization onto the individual dielectric tape layers and laminating the metallized layers under low temperature and pressure to produce a monolithic unfired multilayer body. Release tape was then placed on the surfaces of the unfired dielectric part and the composite structure fired in accord with the method of the invention.

Initially, 3"×3" blank layers were cut from the tape and screen printed with Du Pont 6142 Ag conductor metallization when appropriate in a cross-hatched test pattern. The test pattern was designed to replicate a high density conductor pattern. Individual layers were laminated together at 3000 PSI and 70° C. for 10 min. Three layers of 4.0 mil release tape were placed on the surfaces of the laminated monolith. The unfired release tape/circuit part was placed between $Al_2O_3$ porous plates and Hanes Alloy support dies. The entire constraining set-up was then heated in a Fisher box furnace retrofitted with push rods to apply an external load. The Du Pont Green Tape specimens were heated at 3° C./min to 600° C., 5° C./min to 850° C. and held at 850° C. for 0.5 hrs. The low k Du Pont Green Tape specimens were heated at 3° C./min to 600° C., 5° C./min to 925° C., and held at 925° C. for 0.5 hrs. 20 PSI of pressure was uniaxially applied throughout the heating cycle. In some instances it may be more desirable to laminate the dielectric tape layers and the release tape layers in one processing step to form a multilayered dielectric/release tape composite. The number of layers of release tape can also be varied. Three to four layers of release tape are typically used. The samples were not sinter bonded to a rigid substrate.

In order to precisely and accurately measure linear dimensional changes during firing, which are in accord with the tolerances required in multilayer packages, a photolithographic process was used to place a relatively high resolution pattern of 25 Au cross-hatches with 1 mil line widths on the surface of the 3"×3" blanked dielectric tape layers in a simple 2"×2" matrix (For the 1"×2" samples, a 1"×2" matrix was applied). The cross hatch matrix was examined by an optical microscope before and after firing. The locations of the individual cross hatches within the matrix were digitized and recorded in computer memory. Using the computer to drive a precision X-Y table, the matrix was rastered and the linear distances between individual cross hatches anywhere on the surface of a part were calculated to an accuracy of ±0.1 mil. A total of 20 random linear dimension changes were measured for each of the seven sample configurations listed in table 1, and two specimens per sample configuration were measured.

Table 1 shows mean linear dimension changes, $\Delta l/l_o$, where $\Delta l$ is the change in linear distance between two selected cross hatches as a result of firing and $l_o$ is the initial linear distance between them. "Alternated" refers to the orientation of the individual tape layers within the sample. During doctor blade casting, particles have a tendency to align themselves in the machine direction which has been shown to affect shrinkage during firing. Thus it is often desirable to alternate the casting direction of the individual tape layers to minimize casting effects.

TABLE 1

| Example Number | Sample Configuration | Shrinkage ($\Delta l/l_O$) | Std. Dev. |
|---|---|---|---|
| Green Tape, k~6 | | | |
| 1 | 2" × 2", 8 layers, alternated, no metal | 0.002425 | 0.000560 |
| 2 | 2" × 2", 8 layers, not alternated, no metal | 0.002272 | 0.000586 |
| 3 | 2" × 2", 8 layers, alternated, two layers of metal | 0.001865 | 0.000570 |
| 4 | 2" × 2", 8 layers, alternated, six layers of metal | 0.002407 | 0.000631 |
| 5 | 1" × 2", 8 layers, alternated, no metal | 0.002391 | 0.000465 |
| 6 | 1" × 2", 8 layers, not alternated, no metal | 0.002393 | 0.000746 |
| Low k Green Tape, k~4 | | | |
| 7 | 2" × 2", 8 layers, alternated, no metal | 0.000300 | 0.000555 |

The 0.2% shrinkage measured for the higher k green tape is largely due to a material thermal expansion effect and is not attributed to sintering effects. The results show that shrinkage during firing for a number of sample configurations and for two different materials systems is virtually eliminated and that linear dimensions can be controlled to a degree of accuracy previously unattainable. The results also show that sample geometry and metallization density do not affect shrinkage behavior. For comparison, typical free sintered (i.e. not constrained) multilayer Du Pont Green Tape parts have a $\Delta l/l_o$ of 0.12 and an error of ±0.002 where shrinkage is highly influenced by part geometry and conductor metal density. Since the process offers such tight dimension tolerance during processing, dimensional control is not an important issue when fabricating multilayer parts by this technique.

In practical constrained sintering applications where the dielectric tape is sintered on a rigid substrate or when unlike materials are combined, such as burying metal conductor lines between layers of dielectric, cracks and other flaws may form during the process. During constrained sintering, cracks may occur for many of the same reasons as they do during conventional sintering and it has been found that some application of pressure during sintering may eliminate cracks in many cases.

To eliminate cracking during constrained sintering, it is important to have well characterized starting materials with known particle size distributions and compositions to ensure flaw-free final parts. This is recognized in standard ceramic processing methodology. When combining green materials with different sintering characteristics, as is the case when combining dielectrics and conductor metals, the materials can be selected to sinter at similar times, temperatures, and shrinkages, which reduces the likelihood of crack generation. On the other hand, when sintering a dielectric green tape on a rigid substrate, the sintering dielectric tape is put into tension during firing since the substrate is rigid and the dielectric tends to shrink in the plane of the sample. Furthermore, when the dielectric tape contains a cavity (an integrated circuit chip would be mounted inside the cavity on the rigid substrate), the corners of the cavity act as stress concentrators and cracks will appear at the cavity corners under certain stress conditions. Consequently, one should preferably match the coefficient of thermal expansion of the rigid substrate with the coefficient of thermal expansion of the sintering tape or more preferably make the coefficient of thermal expansion of sintering tape greater than the coefficient of thermal expansion of the rigid substrate, in order to avoid placing the sintering powder in tension during processing since the unsintered tape is relatively weak in tension.

Another approach to sintering green dielectric tapes on a rigid substrate is to make the coefficient of thermal expansion of the release tape less than the coefficient of thermal expansion of the sintering dielectric tape. This has the effect of putting the dielectric tape in compression during sintering. In the case where a dielectric tape is constrain-sintered alone (not on a rigid substrate), it is again desirable to have the coefficient of thermal expansion of the release tape less than the coefficient of thermal expansion of the sintering dielectric tape to obtain a compressive force.

The application of a pressure force load also has been found to influence cracking. When sintering a dielectric on a rigid substrate, it is sometimes desirble to remove the load during the binder removal (burnoff) portion of the processing cycle, but apply it during the sintering portion. During binder removal, the part shrinks (typically $< \sim 0.5\%$). This puts the ceramic powder in tension and can lead to cracks, especially in the cavity case. By not applying the load during the binder removal phase, the stress and cracking are reduced. Another approach is to increase the load substantially during binder removal. This has the effect of preventing the part from shrinking during the binder removal portion of the cycle, thus reducing the stress and cracking. The temperature at which the binder burnout phase of the firing step is completed will vary in accordance with the thermal degradation characteristics of the particular binders used in the green tape. For most organic polymers, burnout is substantially completed at 350°–400° C. and is certainly completed by the time the firing temperature reaches 500° C.

Another method independent of a pressure force load is to increase the heating rate during part heatup. This has the effect of overlapping the binder burnout and sintering cycles of the process which has been found to reduce cracking in the part.

We claim:

1. A method for reducing X-Y shrinkage during firing of a green ceramic body comprising the sequential steps of a. Providing a green ceramic body comprising an admixture of finely divided particles of ceramic solids and sinterable inorganic binder dispersed in a volatilizable solid polymeric binder;

b. Applying to a surface of the green ceramic body a flexible release layer comprising finely divided particles of non-metallic inorganic solids dispersed in volatilizable organic medium comprising at least 10% by volume, basis non-metallic inorganic solids, of volatilizable polymeric binder, the Penetration of the sinterable inorganic binder being no more than 50 μm;

c. While maintaining unidirectional pressure normally to the exposed surface of the release layer, firing the assemblage at a temperature and for a time sufficient to effect volatilization of the polymeric binders from both the green tape and the release layer, sintering of the inorganic binder in the green tape without incurring radial bulk flow of the sintered tape, and the formation of interconnected porosity in the release layer;

d. Cooling the fired assemblage;

e. Releasing the pressure from the cooled assemblage; and f. Removing the porous release layer from the surface of the sintered ceramic green tape.

2. The method of claim 1 in which the sintering temperature of the non-metallic inorganic solids in the release layer is at least 50° C. higher than the sintering temperature of the inorganic binder in the green ceramic body.

3. The method of claim 1 in which the non-metallic inorganic solids in the release layer are ceramic solids.

4. The method of claim 1 in which the green ceramic body is one or more layers of ceramic green tape.

5. The method of claim 4 in which the ceramic solids in the green tape are selected from $Al_2O_3$, $SiO_2$, and mixtures and precursors thereof.

6. The method of claim 3 in which the ceramic solids in the release layer are selected from $Al_2O_3$, $CeO_2$, $SnO_2$, $MgO$, $ZrO_2$ and mixtures thereof.

7. The method of claim 3 in which the ceramic solids in both the green ceramic body and the release layer are alumina.

8. The method of claim 2 in which the sintering temperature of the inorganic binder in the green ceramic tape is 600°–900° C.

9. The method of claim 1 in which the inorganic binder is an amorphous crystallizable glass.

10. The method of claim 1 in which the inorganic binder is an amorphous vitrifiable glass.

11. The method of claim 4 in which the ceramic solids and inorganic binder contents of the green tape constitute 30–70% by volume of the ceramic green tape and the non-metallic inorganic solids content of the release layer constitutes 10–50% by volume of the release layer.

12. The method of claim 4 in which the average particle size of the solids in the green tape and release layer is 1–20 microns with less than 30% by volume of such particles having a particle size less than 1 micron.

13. The method of claim 1 in which the contact angle of the inorganic binder on the non-metallic solids of the release layer is greater than 60 degrees.

14. The method of claim 1 in which the viscosity of the sinterable inorganic binder is at least $1 \times 10^5$ poise.

15. The method of claim 1 in which the interconnected pore volume of the fired release layer is at least 10% of the total volume of the fired release layer.

16. The method of claim 4 in which an exposed surface of the unfired green tape is laminated to a pre-fired planar ceramic substrate prior to firing.

17. The method of claim 16 in which an exposed surface of ceramic green tape is laminated to both sides of the planar ceramic substrate.

18. The method of claim 16 or 17 in which at least one surface of the subtrate contains a conductive pattern.

19. The method of claim 4 in which a thick film conductive pattern is applied to the fired tape after removal of the release layer and the pattern is fired to effect volatilization of the organic medium therefrom and sintering of the conductive solids therein.

20. The method of claim 19 in which the conductive material in the pattern is a noble metal or mixture or alloy thereof.

21. The method of claim 20 in which the noble metal is gold or a gold alloy.

22. The method of claim 19 in which the conductive material in the pattern is copper or a precursor thereof.

23. The method of claim 1 in which the unilateral pressure is first applied upon completion of the volatilization of the polymeric binders.

24. The method of claim 1 in which the unilateral pressure is first applied upon the onset of sintering of the inorganic binder in the green tape.

25. The method of claim 4 in which at least one layer of green tape has printed thereon an unfired pattern of thick film electrically functional paste and the assemblage is co-fired.

26. The method of claim 25 in which the thick film electrically functional paste is a resistor.

27. The method of claim 25 in which the thick film electrically functional paste is a conductor.

* * * * *